United States Patent [19]
Plessky et al.

[11] Patent Number: 6,043,585
[45] Date of Patent: Mar. 28, 2000

[54] ACOUSTIC WAVE FILTER

[75] Inventors: Victor Plessky, Bevaix; Serguei Kondratiev, Neuchâtel, both of Switzerland

[73] Assignee: Nokia Mobile Phones Limited, Salo, Finland

[21] Appl. No.: 08/818,572

[22] Filed: Mar. 14, 1997

[30] Foreign Application Priority Data

Mar. 29, 1996 [GB] United Kingdom .................. 9606741

[51] Int. Cl.$^7$ ................................................. H01L 41/08
[52] U.S. Cl. .............................. 310/313 R; 310/313 D; 333/193
[58] Field of Search .................. 310/313 R, 313 D, 310/313 B; 333/193

[56] References Cited

U.S. PATENT DOCUMENTS

| | | |
|---|---|---|
| 4,185,218 | 1/1980 | Bagdasarian et al. ................. 310/313 |
| 5,349,260 | 9/1994 | Anemogiannis et al. .......... 310/313 D |
| 5,471,178 | 11/1995 | Hickernell ............................... 333/193 |
| 5,471,499 | 11/1995 | Brown et al. ....................... 333/193 X |
| 5,581,141 | 12/1996 | Yamada et al. .................... 310/313 B |
| 5,604,393 | 2/1997 | Suzuki et al. ...................... 310/313 D |
| 5,717,274 | 2/1998 | Eguchi et al. ...................... 310/313 R |
| 5,731,748 | 3/1998 | Tada ........................................ 333/193 |
| 5,790,000 | 8/1998 | Dai et al. ................................ 333/193 |

FOREIGN PATENT DOCUMENTS

| | | |
|---|---|---|
| 0 196 770 A2 | 10/1986 | European Pat. Off. . |
| 0633660 A1 | 1/1995 | European Pat. Off. . |
| 2 232 546 | 12/1990 | United Kingdom . |
| 2 288 504 | 10/1995 | United Kingdom . |

Primary Examiner—Mark O. Budd
Attorney, Agent, or Firm—Perman & Green, LLP

[57] ABSTRACT

A surface acoustic wave filter provided on a substrate, in which input "hot" and ground busbars and output "hot" and ground busbars are disposed substantially symmetrically with respect to an axis lying between the input and the output of the filter.

19 Claims, 6 Drawing Sheets

ACOUSTIC WAVE FILTER

BACKGROUND OF INVENTION

This invention relates to acoustic wave filters.

One type of acoustic wave filter is the SAW (surface acoustic wave) filter, which makes use of surface acoustic waves. One layout for acoustic wave filters is the impedance element filter. This comprises a number of impedance elements (e.g. one port SAW devices) connected together in a network—for instance in a ladder or balanced bridge network scheme. The impedance elements are connected together electrically but normally do not interact acoustically to any significant extent.

A common network scheme is the ladder network, which is illustrated as a circuit diagram in FIG. 1. FIG. 1 shows a ladder network of impedance elements 1a, 1b arranged between an input point 2, an output point 3 and a ground 4. The network includes impedance elements 1a arranged in series between the input and the output, and impedance elements 1b arranged in parallel between ground and the nodes between the elements 1a. An input voltage is applied between the "hot" input point 2 and ground. The output voltage is taken from between "hot" output point 3 and ground. The number of elements in the network and their impedances may be chosen to give the network the desired electrical properties. The electrical behaviour of a ladder network of impedances is well known.

An entire SAW device is commonly provided on a single piezoelectric substrate, with the aim of reducing the size of the device. Small size is important if the device is to be used in compact apparatus such as a hand-held radio telephone. All the impedance elements of a ladder-type SAW filter may be defined on a single substrate by providing a pattern of metallisation (for example vapour deposited aluminium) on a substrate of a suitable piezoelectric material (for example quartz, lithium niobate or lithium tantalate). The pattern of metallisation defines the regions of the substrate that are to serve as the impedance elements. FIG. 2 illustrates such a filter schematically. FIG. 2 shows a three-element ladder-type SAW impedance element filter. Impedance element 5 is arranged between "hot" input 6 and "hot" output 7. Impedance element 8 is arranged between the input end of element 5 and a ground 9. Impedance element 10 is arranged between the output end of element 5 and ground 9. A single, unitary region of metallisation forms the ground. Each impedance element includes an interdigital transducer (IDT) which has a pair of opposed metallised busbars 5a,5b,8a, 8b,10a,10b and a set of interdigitated, metallised fingers 5c, 8c, 10c extending from the busbars. When a signal is applied between the "hot" input and ground, surface acoustic waves propagate inside each transducer, through the piezoelectric substrate between the busbars. Reflectors, i.e. reflective configurations of metallisation, (not shown) may be provided to help confine the waves to the transducers. By altering the geometry of the elements (for example by varying the spacing of the busbars and the number, size, spacing and overlap of the fingers) the impedance properties of the transducers and therefore the response of the filter as a whole can be controlled. The filter is connected to other devices off the substrate 12a (for instance elsewhere on circuit board 12b) by wires 13 connected to the input, output and ground.

Ladder-type SAW filters typically exhibit low loss in the passband (less than 2 dB in many cases), reasonable suppression in the stopband on either side of the passband (more than 40 dB in some cases) and acceptable power handling capability.

SUMMARY OF THE INVENTION

According to the present invention from one aspect there is provided a surface acoustic wave filter provided on a substrate, having first and second input busbars and first and second output busbars which are disposed substantially symmetrically about an axis lying between the input and the output of the filter and passing through a transducer of the filter.

Preferably the busbars are defined by electrode regions (suitably of metallisation) and these are preferably disposed substantially symmetrically with respect to the axis. Suitably the axis bisects the said transducer, preferably passing between the busbars of the transducer, and most preferably passing substantially mid-way between those busbars The first input busbar and the first output busbar are suitably ground busbars, which are preferably disjoint. The second input busbar and the second output busbar are suitably "hot" busbars. The input busbars are suitably directly electrically connected to inputs to the filter. The output busbars are suitably directly electrically connected to outputs from the filter.

The symmetry of the filter may be mirror symmetry (about one or more axes) or rotational symmetry (suitably two-fold). The busbars and/or electrode regions may be disposed symmetrically, especially as regards their outlines (and ignoring fingers of transducers etc.).

According to the present invention from a second aspect there is provided a surface acoustic wave filter provided on a substrate, comprising a transducer and a first reflector for surface acoustic waves at one end of the transducer, the first reflector being integral with a region of conductive material that defines a busbar of the filter.

According to the present invention from a third aspect there is provided a surface acoustic wave filter provided on a substrate, comprising: an input busbar and a ground busbar associated therewith; an output busbar and a ground busbar associated therewith; a first impedance element arranged between the input busbar and the output busbar; a second impedance element arranged between the input end of the first impedance element and a first ground region on the substrate; and a third impedance element arranged between the input end of the first impedance element and a second ground region on the substrate; the first and second ground regions being separate.

According to the present invention from a fourth aspect there is provided a surface acoustic wave filter provided on a substrate, having a first generally rectangular region of conductive material defining one busbar and a second generally rectangular region of conductive material abutting the first region and defining another busbar.

BRIEF DESCRIPTION OF THE DRAWINGS

The present invention will now be described by way of example with reference to FIGS. 3 to 8 of the accompanying drawings, in which:

FIG. 3b is an equivalent circuit diagram for the filter of FIG. 3a;

FIG. 4b is an equivalent circuit diagram for the filter of FIG. 4a;

FIG. 5b is an equivalent circuit diagram for the filter of FIG. 5a;

FIG. 6b is an equivalent circuit diagram for the filter of FIG. 6a;

FIG. 7b is an equivalent circuit diagram for the filter of FIG. 7a; and

FIG. 8 is a graph showing the frequency response of a filter represented by FIG. 4a.

DETAILED DESCRIPTION OF THE INVENTION

Figure 1:
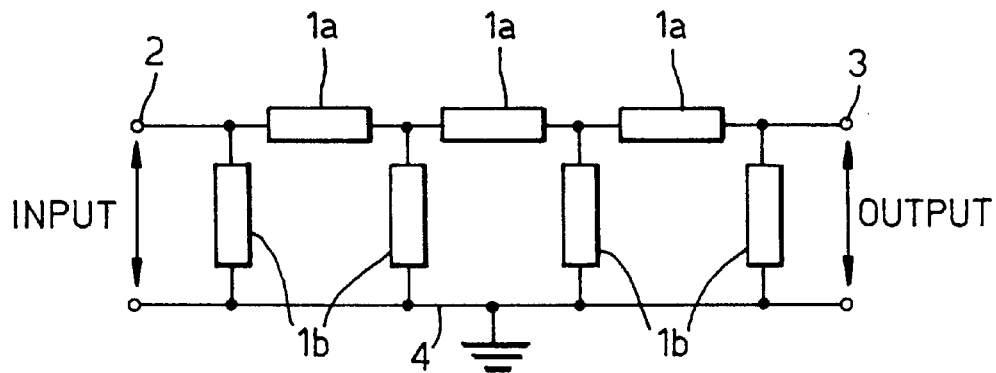
Figure 2:
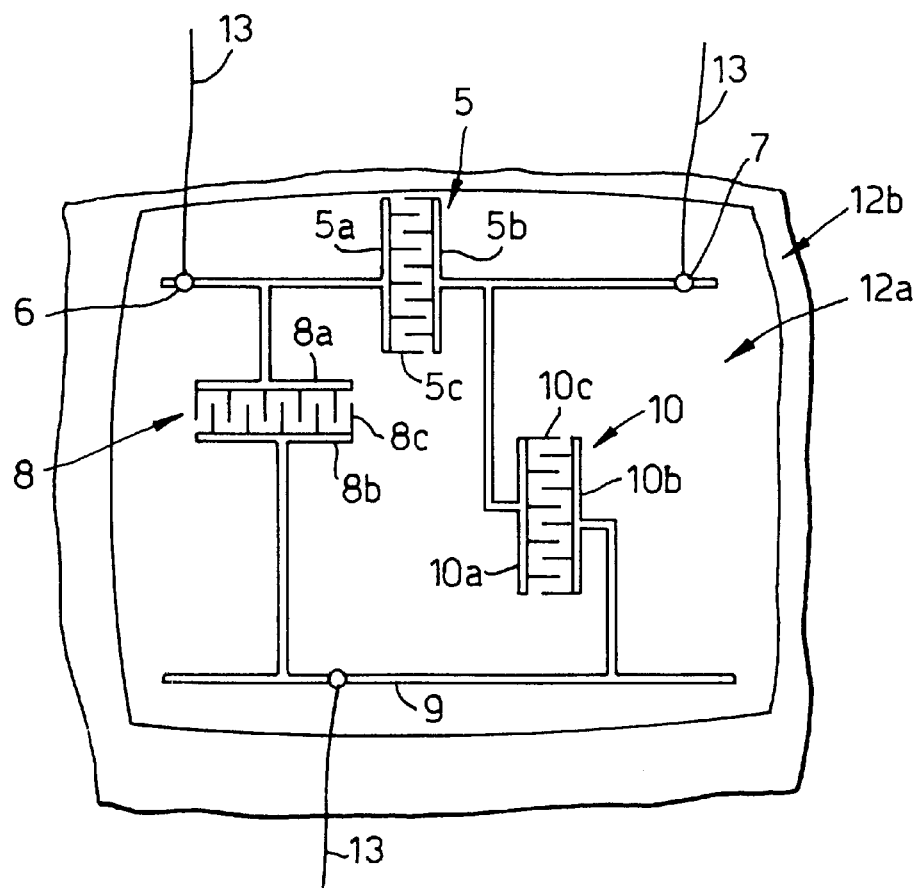

Each of the filters shown in FIGS. 3a to 7a is a ladder-type SAW impedance element filter. Each filter is provided on a substrate of a suitable cut of piezoelectric material such as quartz, lithium niobate or lithium tantalate. Electrode regions, which between each other define SAW transducers, are defined on the substrate by areas of conductive material, suitably areas of metallisation. The metallisation may be formed by vapour deposition of aluminium for instance. For protection, the substrate with the metallised regions can be packaged in the conventional way.

In the figures each SAW transducer of the filters comprises a pair of opposed, parallel busbars (each constituted by a block of metallisation) and a linear array of fingers of metallisation extending from each busbar. The fingers of the opposite busbars overlap, are interdigitated alternately and extend perpendicularly to their busbars. Typically 100 to 500 fingers are used in practice in each transducer, but only a few fingers are illustrated schematically in the drawings. It will be appreciated that other transducer arrangements are possible within the scope of the present invention. The cut of the substrate (i.e. the crystallographic plane in which the surface of the substrate lies) and the orientation of the transducers on the substrate are chosen to give the desired degree of coupling to surface acoustic waves.

Figure 3A:
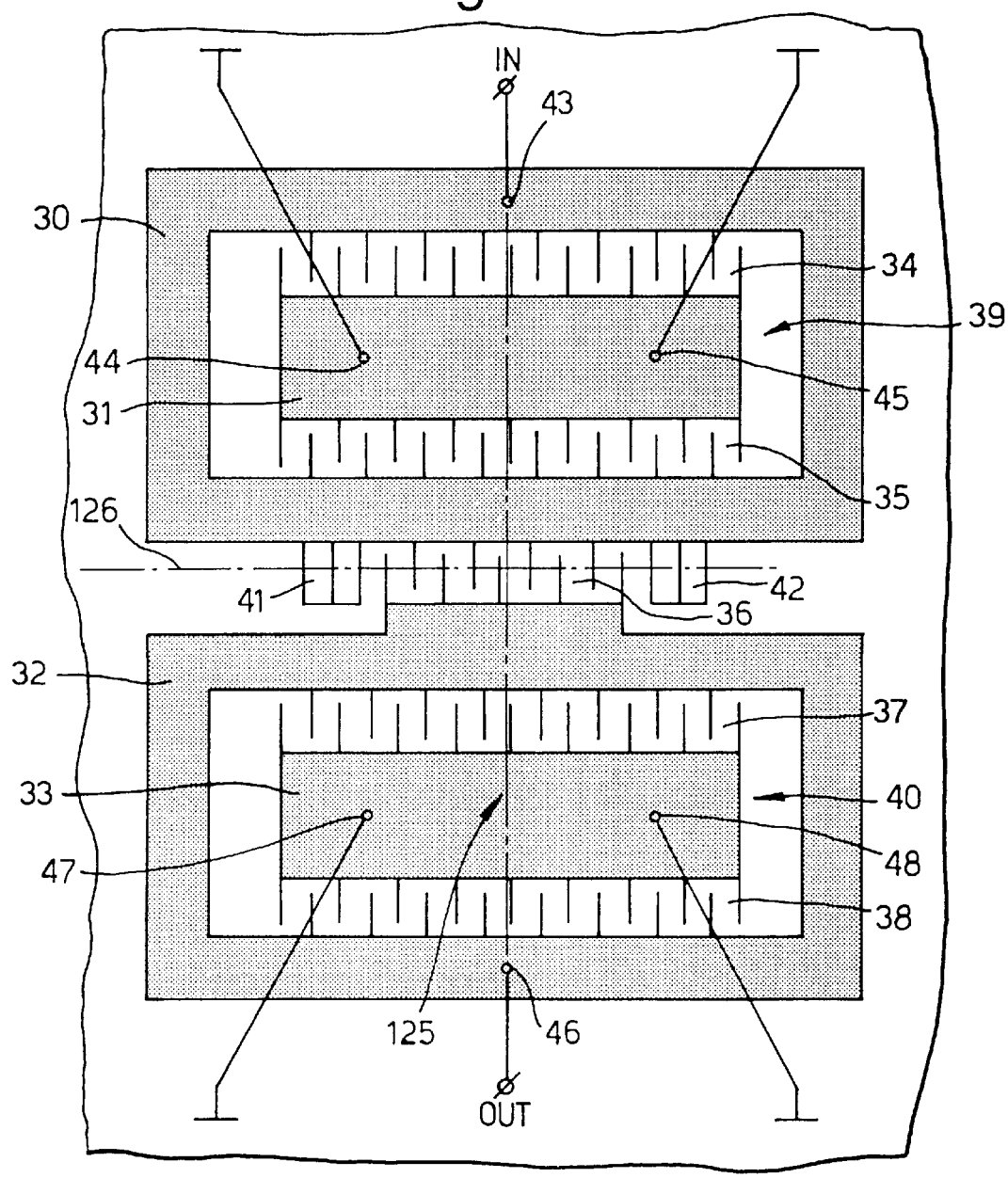
FIG. 3a is a schematic diagram of the metallised substrate of a SAW filter.
Figure 3B:
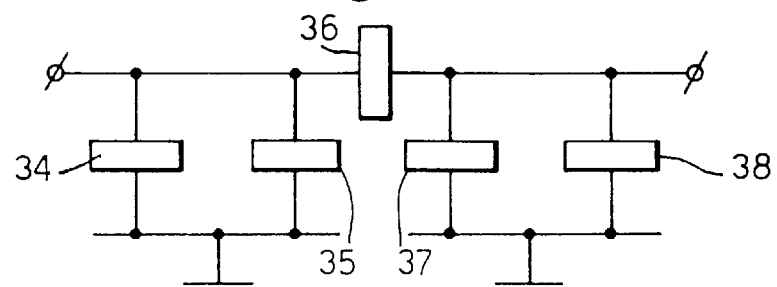

FIG. 3a shows one filter and FIG. 3b its equivalent circuit. The filter has four electrode regions 30 to 33 and five transducers 34 to 38. Four of the transducers are paired to form two combined impedance elements 39,40 having two transducers each (34,35 and 37,38 respectively). Reflectors 41,42 are provided at the ends of transducer 36. At the input of the filter the input signal to the filter is applied between "hot" input connection 43 and ground connections 44,45. At the output of the filter the output signal from the filter is received from between "hot" output connection 46 and ground connections 47,48. Region 30 can therefore be referred to as an input ("hot") electrode region, region 32 an output ("hot") electrode region and regions 31 and 33 ground input and ground output electrode regions respectively. The connections connect conductive wires to the metallisation for coupling to and from the filter. Ground regions 31 and 33 are surrounded by regions 30 and 32 respectively. The busbars of the filter of FIG. 3a have mirror symmetry about the axis 125 running through the centres of regions 31 and 33 and the centres of regions 30 and 32; substantially mirror symmetry about the axis 126 running mid-way between and parallel to the busbars of transducer 36; and substantially two-fold rotational symmetry about the intersection of those axes. The filter is not exactly symmetrical about axis 126 because one busbar of transducer 36 projects slightly from the remainder of output region 32 so that the reflectors 41, 42 do not make contact with output region 32. Electrically, as shown in FIG. 3b, transducers 34 and 35 are in set parallel between the input region and ground; transducers 37 and 38 are set in parallel between the output region and ground; and transducer 36 is set between the input region and the output region.

The filter of FIG. 3a comprises two rectangular "hot" electrode regions 30,32 and ground electrode regions 31,33 located in the central rectangular apertures of the "hot" electrode regions. By means of there being no direct electrical connection between the ground electrode regions, and by means of the intervening hot electrodes, the ground electrode regions are isolated from each other.

Figure 4A:
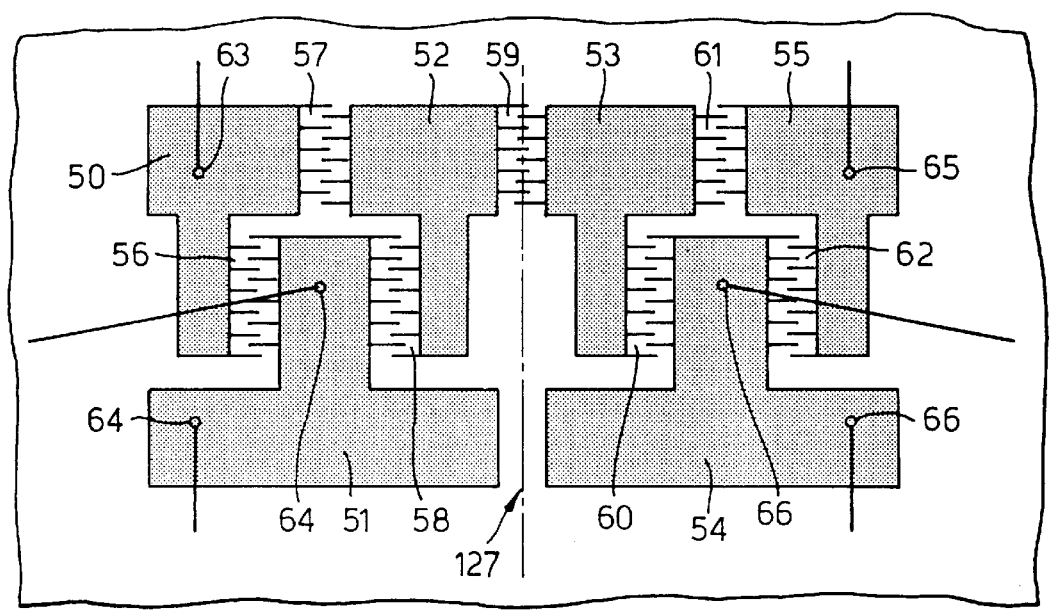
FIG. 4a is a schematic diagram of the metallised substrate of another SAW filter.
Figure 4B:
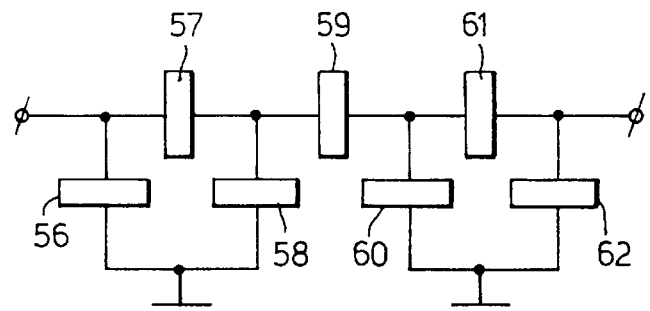

FIG. 4a shows another filter and FIG. 4b its equivalent circuit. The filter has six electrode regions 50 to 55 and seven transducers 56 to 62. The input signal to the filter is applied, via connecting wires, between "hot" input connection 63 and ground connections 64. The output signal from the filter is received from between "hot" output connection 65 and ground connections 66. Region 50 can therefore be referred to as an input "hot" electrode region, region 55 an output "hot" electrode region and regions 51 and 54 ground electrode regions. Regions 52 and 53 are intermediate electrode regions. The ground regions are connected together off the substrate, and preferably outside the package of the SAW device, via the connections 64 and 66. The busbars of the filter of FIG. 4a have mirror symmetry about the axis 127 running mid-way between and parallel to the busbars of transducer 59. Electrically, transducers 57,59 and 61 are set in series between the input region and the output region, and transducers 56,58,60 and 62 are set in parallel between the ground regions and the ends of the other transducers.

Figure 5A:
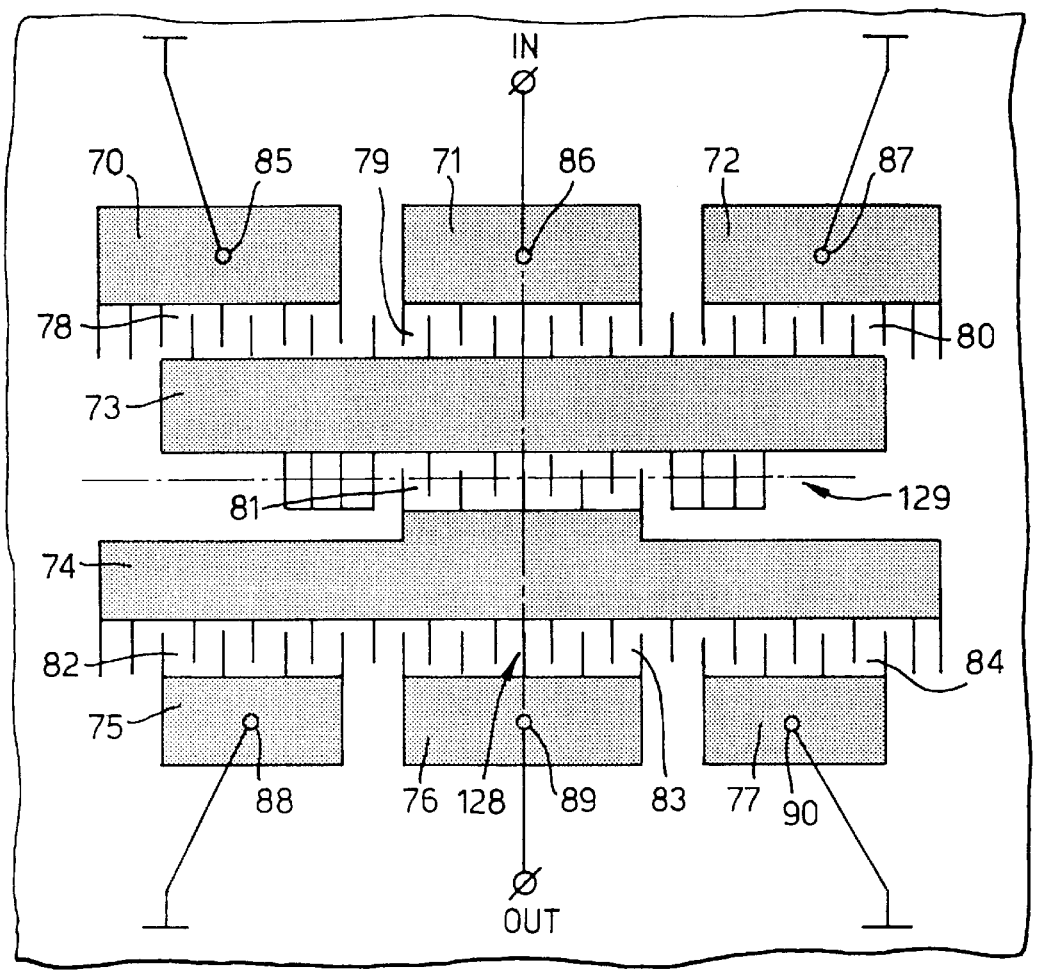
FIG. 5a is a schematic diagram of the metallised substrate of another SAW filter.
Figure 5B:
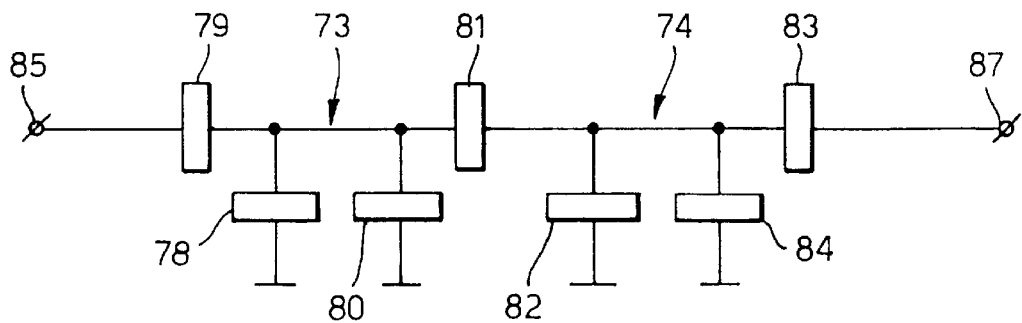

FIG. 5a shows another filter and FIG. 5b its equivalent circuit. The filter has eight electrode regions 70 to 77 and seven transducers 78 to 84. Reflectors are provided at the outer ends of transducers 78,80,81,82 and 84 and between transducers 78,79 and 80 and 82,83 and 84. The input signal to the filter is applied between "hot" input connection 86 and ground connections 85 and 87. The output signal from the filter is received from between "hot" output connection 89 and ground connections 88 and 90. Region 71 can therefore be referred to as an input "hot" electrode region, region 76 an output "hot" electrode region and regions 70,72,75 and 77 ground electrode regions. Regions 73 and 74 are intermediate electrode regions. The busbars of the filter of FIG. 5a have mirror symmetry about the axis 128 running through the centres of regions 71 and 76 and the centres of regions 73 and 74; substantially mirror symmetry about the axis 129 running mid-way between and parallel to the busbars of transducer 81; and substantially two-fold rotational symmetry about the intersection of those axes. The filter is not exactly symmetrical about axis 129 because one busbar of transducer 81 projects slightly from the remainder of intermediate region 74 so that the reflectors at the ends of that transducer do not make contact with intermediate region 74. Electrically, transducer 79 is set between input region 71 and intermediate region 73; transducers 78 and 80 are set in parallel between intermediate region 73 and ground regions 70 and 72; transducer 81 is set between intermediate region 73 and intermediate region 74; transducers 82 and 84 are set between intermediate region 74 and ground regions 75 and 77; and transducer 83 is set between intermediate region 74 and output region 76.

In the filter of FIG. 5a a pair of ground electrode regions is associated with each "hot" electrode region: each "hot" electrode region lies between and aligned with the associated ground electrodes. To isolate the pairs of ground regions from each other the intermediate electrode regions are both elongate and extend between the pairs of ground regions.

Figure 6B:
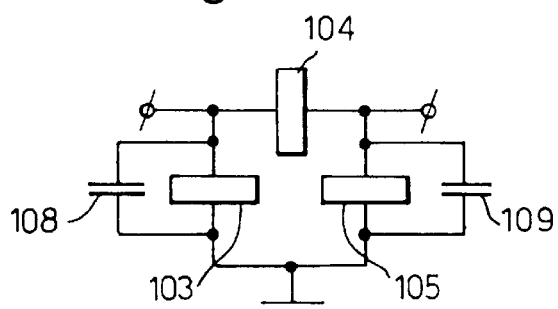
Figure 6A:
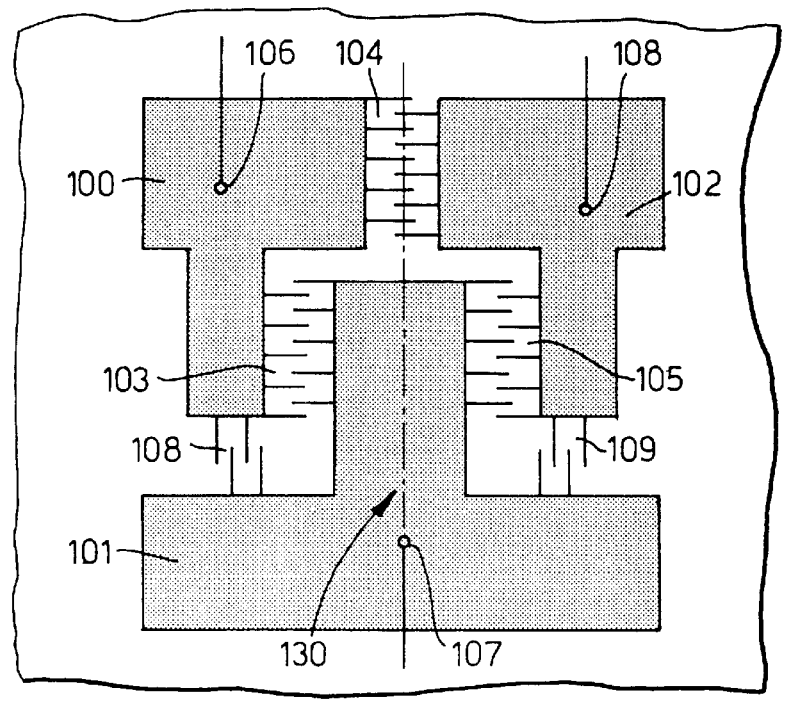
FIG. 6a is a schematic diagram of the metallised substrate of another SAW filter.

FIG. 6a shows another filter and FIG. 6b its equivalent circuit. The filter has three electrode regions 100 to 102 and three transducers 103 to 105. The input signal to the filter is applied between "hot" input connection 106 and ground connection 107. The output signal from the filter is received from between "hot" output connection 108 and ground connection 107. Region 100 can therefore be referred to as an input "hot" electrode region, region 102 an output "hot" electrode region and region 101 a ground electrode region. Electrically, transducer 103 is set between input region 100 and ground region 101; transducer 104 is set between input region 100 and output region 102 and transducer 105 is set between output region 102 and ground region 101.

The filter of FIG. 6a includes capacitors 108, 109 which are defined by elongate fingers of metallisation on the substrate which extend from the electrode region 101 towards the electrode regions 100 and 102 and from those latter electrode regions towards electrode region 101. The fingers are interdigitated alternately and extend perpendicularly to their busbars. The structure of the capacitors is similar to that of the other transducers except that, to achieve their capacitive behaviour, the major axis of each capacitor (running between its busbars) is rotated with respect to the major axes of the other transducers to an angle at which its interdigitated structure is weakly coupled to acoustic waves (especially surface acoustic waves). In the embodiment of FIG. 6a the major axes of the capacitors are rotated by 90 degrees with respect to those of the other transducers. The capacitors allow the resonance-antiresonance frequency gap of the filter to be regulated. They also give improved flexibility of design because they are equivalent to using different and tunable coupling forces for other impedance elements. The suppression level can also be improved using additional capacitances.

Figure 7B:
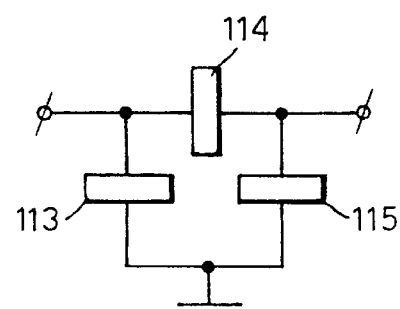
Figure 7A:
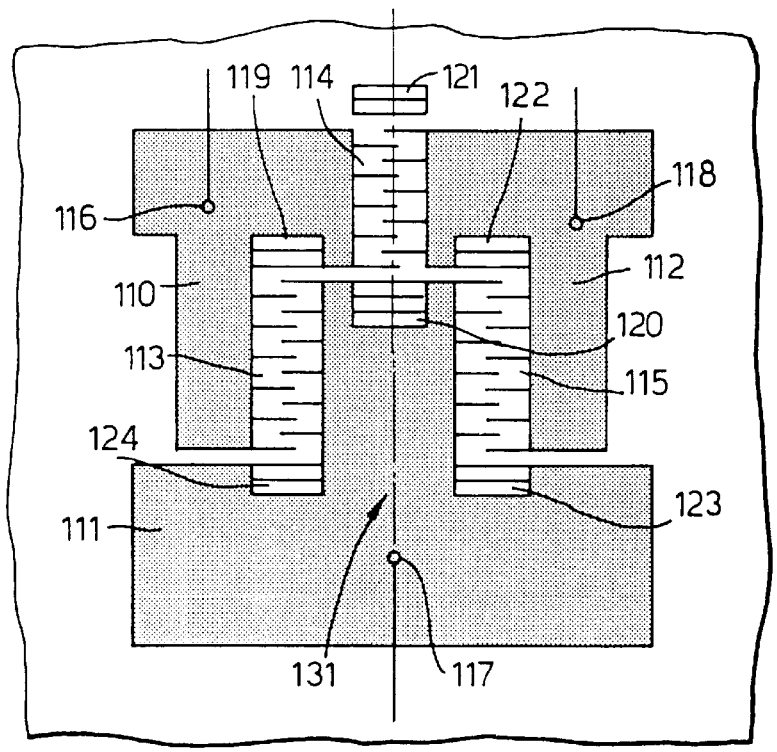
FIG. 7a is a schematic diagram of the metallised substrate of another SAW filter.

FIG. 7a shows another filter and FIG. 7b its equivalent circuit. The filter has three electrode regions 110 to 112 and three transducers 113 to 115. The input signal to the filter is applied between "hot" input connection 116 and ground connection 117. The output signal from the filter is received from between "hot" output connection 118 and ground connection 117. Region 110 can therefore be referred to as an input electrode region, region 112 an output electrode region and region 111 a ground electrode region. Electrically, transducer 113 is set between input region 110 and ground region 111; transducer 114 is set between input region 110 and output region 112 and transducer 115 is set between output region 112 and ground region 111.

The filter of FIG. 7a includes reflective configurations 119 to 124 defined by regions of metallisation. These reflectors comprise strips of metallisation which (as is well known in the art) are spaced apart so as to reflect surface acoustic waves back to the transducers. The strips are inset into and run across bays in the electrode regions. Each reflector is integral with its associated electrode region. The strips are parallel with the fingers of the busbars and perpendicular to the major axes of the transducers. The bays or recesses are aligned with the respective transducers so that the sides of the bays are co-linear with the side walls of the busbars of the associated transducer. The design of the filter is chosen so that most of the transducers have at both their ends a reflector set into an electrode region of the filter (i.e. an electrode region that comprises a busbar of another transducer).

The busbars of the filters of FIGS. 6a and 7a have mirror symmetry about the axes 130, 131 running through the centres of regions 107 and 117 and mid-way between input and output regions 100, 102 and 110, 112.

Some properties of the filters of FIGS. 3a to 7a will now be discussed in more detail.

All the filters shown in FIGS. 3a to 7a have some degree of symmetry. They all have mirror symmetry (or at least substantial mirror symmetry) of their busbars about axes (126, 127, 129, 130, 131) mid-way or substantially mid-way between their input and output regions. The filters of FIGS. 3a and 5a also have mirror symmetry (or at least substantial mirror symmetry) about axes joining the mid-points of their input and output regions so they have two mutually perpendicular axes of symmetry. The input and output regions are elongate parallel to those axes. In each case the outlines of the busbars (particularly each of their edges that bound the electrode regions), and indeed the outlines of the entire electrode regions (excluding the fingers), as well as their centres of mass are symmetrical. In the figures all the busbars and electrode regions are symmetrical but filters could be designed in which substantially all or most or only two of them are symmetrical. The leads shown in the drawings which connect the connections of the filters to the external connectors of the package are also arranged symmetrically in each filter. The symmetry of the filters is thought to reduce the parasitic effect of mutual inductance, for example by decreasing (by compensation) the effects of magnetic fields on the performance of the filters.

In the filters of FIGS. 3a and 4a regions (in particular the ground regions) are provided with more than one connector and hence more than one connecting lead. The leads are arranged electrically in parallel and connected together off the substrate, preferably outside the packaging of the SAW device (for instance on the circuit board to which the device is connected in use). This is thought to reduce parasitic effects because the connecting leads behave in combination like a single lead of larger diameter.

A combination of some symmetric and some non-symmetric leads and the use of one and of more connecting leads in different parts of the filter may be used to influence the characteristics of the device at non-acoustic frequencies, where the output signal level is determined by signals passing through a ladder of static IDT (interdigitated transducer) capacitances as well as electromagnetic feedthrough.

Figure 8:
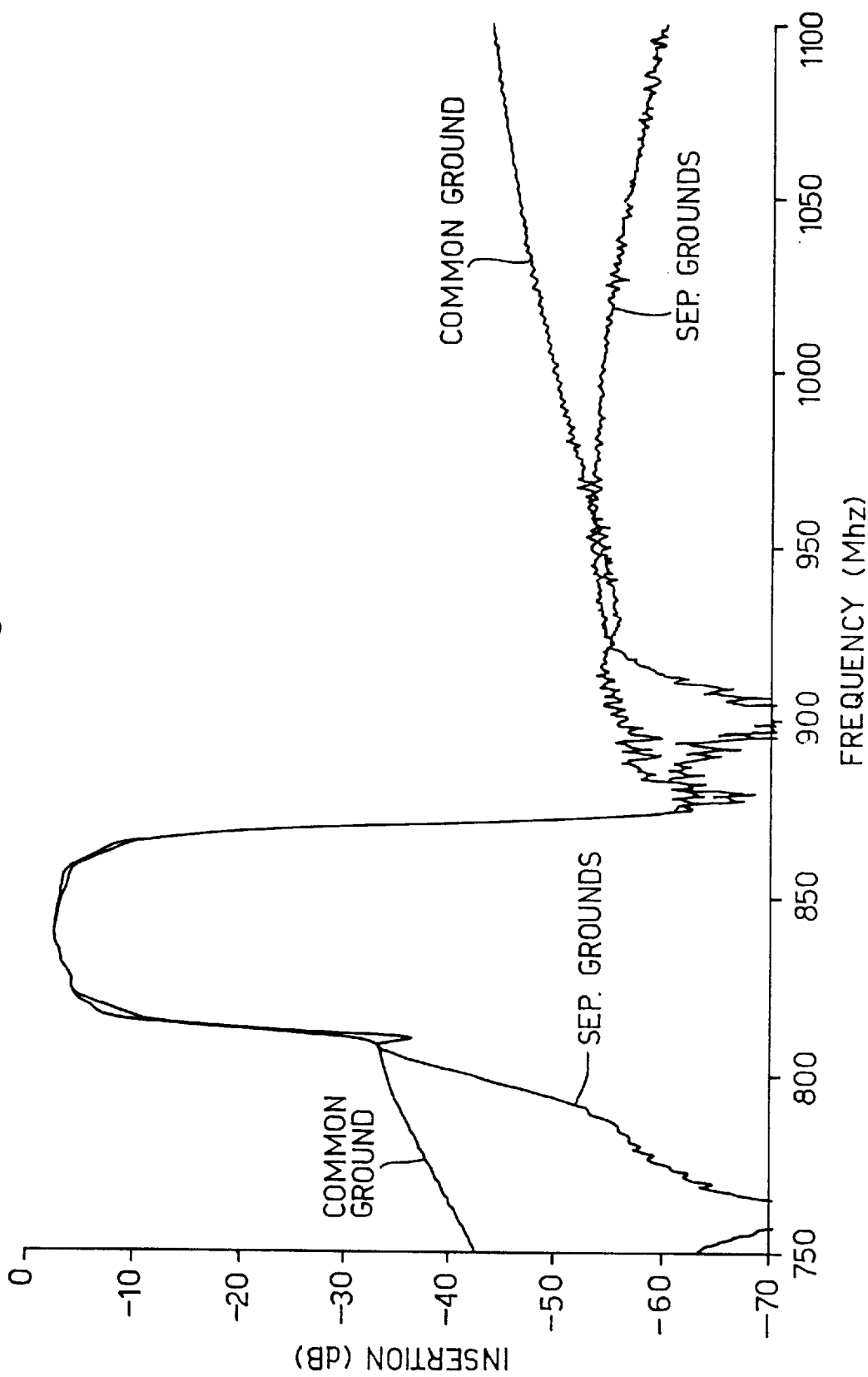

In the filters of FIGS. 3a, 4a and 5a more than one ground region is provided. These ground regions are separate areas of metallisation, disjoint from each other. In the filter of FIG. 4a only the high resistance material of the substrate lies between the two ground regions. In the filters of FIGS. 3a and 5a metallisation that is not electrically connected directly to ground also lies between the ground regions. In each case that metallisation is elongate along an axis lying between the ground regions and extending along that axis beyond the ends of the ground regions. In the filter of FIG. 3a each ground region is surrounded by such metallisation; an alternative would be for the ground regions to be substantially surrounded by such metallisation, preferably with any breaks in the metallisation not lying between the ground regions. In each of FIGS. 3a, 4a and 5a there is no direct electrical connection on the substrate between the ground regions. The separate ground regions are symmetrical and are equally-sized. In the filters of FIGS. 3a and 4a one ground electrode region is associated with and nearer the input electrode region and one associated with and nearer the output electrode region. In the filter of FIG. 5a one pair of ground electrode regions is associated with and nearer the input electrode region and one pair associated with and nearer the output electrode region. The separate ground regions of each filter are connected together off the substrate, preferably outside the packaging of the SAW device (for instance on the circuit board to which the device is connected in use). The use of separate ground regions is thought to reduce parasitic effects. FIG. 8 shows a graph of insertion loss against frequency for a SAW filter of the type represented schematically in FIG. 4a, and for a filter similar except in that its ground regions are directly electrically connected on the substrate itself. In the stopband the filter represented in FIG. 4a exhibits suppression 10 to 30 dB better than the other filter, especially at frequencies below the passband. It is believed that this improvement is due to the avoidance of currents from the input reaching through the ground electrode to parts of the device physically and/or electrically close to the output.

The use of separate grounds has been found to be particularly beneficial in combination with the use of a symmetrical filter design.

Numerous electrode regions (30 to 33; 50 to 55; 73,74; 100 to 102; 110 to 112) of the filters incorporate busbars of more than one transducer, so that the connections between transducers are made by the bodies of the electrode regions themselves, through the bulk of each of the connecting electrode regions. For example, electrode region 51, includes busbars of transducers 56 and 58. In the filters of FIGS. 3a, 4a, 6a and 7a all the electrode regions include busbars of more than one transducer. Some of the regions (for example 107) extend fully between a pair of busbars (for example 103, 105) so that a straight line from any point on one of the busbars to any point on the other busbar passes entirely through the electrode region. In each case apart from electrode regions 30 and 32 there is a rectangular region of the electrode region that includes and defines one busbar and another rectangular region of the same electrode region that abuts the first rectangular region and includes and defines the other transducer. In comparison with other designs, the connection of busbars through the bulks of electrode regions in this way can reduce the resistance between the transducers (by providing a direct or substantially direct conductive path of substantial breadth between the transducers and by allowing for a more compact arrangement of the transducers). This is thought to reduce the parasitic effect of resistance between the transducers and therefore reduce losses in the passband.

The filters of FIGS. 4a, 6a and 7a include electrode configurations in which at least part of one electrode region, the whole of which is T-shaped, has busbars of two transducers at either side of a limb of that region and two adjacent electrode regions provide the opposed busbars of those transducers and also the opposed busbars of a third transducer.

Each filter may advantageously be packaged in a metal enclosure which, together with the metallisation on the substrate, can act as a waveguide with a very high cut-off frequency. This can increase the suppression of parasitic signals at high frequencies. A grounded metallised lid of the package may be used. Suppression can be assisted by filters of compact designs and by generously sized busbars, Clearly, the illustrated filters may be combined together and/or modified to include features that are illustrated in any of the others. The filters shown in the drawings may form part of larger SAW devices. The filters may be used in portable devices such as radio telephones.

In view of the above description it will be clear to a person skilled in the art that various modifications may be made within the scope of the invention. The invention may include any novel features or combinations of features disclosed herein either explicitly or implicitly and any generalisations thereof irrespective of whether they relate to the invention as claimed or mitigate any of the problems addressed by the invention as claimed.

What is claimed is:

1. A filter comprising:
   a substrate; and
   a plurality of electrodes disposed over said substrate;
   wherein a first one of said electrodes surrounds a second one of said electrodes, and a third one of said electrodes surrounds a fourth one of said electrodes, and wherein said first and second electrodes are input terminals of said filter and said third and fourth electrodes are output terminals of said filter; and
   further wherein a first portion of said first electrode and a first portion of said second electrode are situated adjacent to one another on said substrate and form at least a portion of at least one first transducer, a second portion of said first electrode and a first portion of said third electrode are situated adjacent to one another on said substrate and form at least a portion of at least one second transducer, and a second portion of said third electrode and a portion of said fourth electrode are situated adjacent to one another and form at least a portion of at least one third transducer.

2. A filter as set forth in claim 1, wherein a plurality of first metallization fingers extend from said first portion of said first electrode, and a plurality of second metallization fingers extend from said first portion of said second electrode, the plurality of first metallization fingers being interleaved with the plurality of second metallization fingers, wherein a plurality of third metallization fingers extend from said second portion of said third electrode, and a plurality of fourth metallization fingers extend from said portion of said fourth electrode, the plurality of third metallization fingers being interleaved with the plurality of fourth metallization fingers.

3. A filter as set forth in claim 2, wherein a plurality of fifth metallization fingers extend from the second portion of said first electrode and a plurality of sixth metallization fingers extend from the first portion of said third electrode, the plurality of fifth metallization fingers being interleaved with the plurality of sixth metallization fingers.

4. A filter, said filter comprising:
   a substrate;
   a plurality of electrode regions disposed on said substrate, a first portion of a first one of said electrode regions being situated on said substrate between a first portion of each of a second and a third one of said electrode regions, said first portion of said first electrode region and said first portion of said second electrode region forming at least a portion of a first transducer, said first portion of said first electrode region and said first portion of said third electrode region forming at least a portion of a second transducer, and wherein a second portion of said second electrode region and a second portion of said third electrode region are situated adjacent to one another on said substrate and form at least a portion of a third transducer;
   at least one first capacitive element disposed between a second portion of said first electrode region and a third portion of said second electrode region; and
   at least one second capacitive element disposed between a third portion of said first electrode region and a third portion of said third electrode region.

5. A filter as set forth in claim 4, wherein said first electrode region is for being connected to an external ground, said second electrode region is an input terminal, and said third electrode region is an output terminal.

6. A filter as set forth in claim 4, wherein a plurality of first metallization fingers extend from a first side of said first portion of said first electrode region, and a plurality of second metallization fingers extend from said first portion of said second electrode region, the plurality of first metallization fingers being interleaved with the plurality of second metallization fingers, wherein a plurality of third metallization fingers extend from a second side of said first portion of said first electrode region, and a plurality of fourth metallization fingers extend from said first portion of said third electrode region, the plurality of third metallization fingers being interleaved with the plurality of fourth metallization fingers, wherein a plurality of fifth metallization fingers extend from said second portion of said second electrode region, and a plurality of sixth metallization fingers extend from said second portion of said third electrode region, and wherein the plurality of fifth metallization fingers are interleaved with the plurality of sixth metallization fingers.

7. A filter as set forth in claim 4, wherein said at least one first capacitive element comprises:
    a plurality of first metallization fingers extending from said third portion of said second electrode region; and
    a plurality of second metallization fingers extending from said second portion of said first electrode region, wherein the plurality of second metallization fingers are interleaved with the plurality of first metallization fingers; and wherein said at least one second capacitive comprises:
        a plurality of third metallization fingers extending from said third portion of said first electrode region; and
        a plurality of fourth metallization fingers extending from said third portion of said third electrode region, wherein the plurality of third metallization fingers are interleaved with the plurality of fourth metallization fingers.

8. A filter as set forth in claim 4, wherein said second and third electrode regions have a substantially symmetrical arrangement relative to a central axis of said first electrode region.

9. A filter as set forth in claim 4, wherein said filter is a Surface Acoustic Wave (SAW) filter.

10. A filter as set forth in claim 4, and further comprising at least one metallization strip for reflecting acoustic energy produced by at least one of said first, second, and third transducers, so as maintain said acoustic energy within an area of said at least one of said first, second, and third transducers.

11. A filter, said filter comprising:
    a substrate;
    a first plurality of electrode regions disposed on said substrate, each electrode region of said first plurality of electrode regions having at least a first portion, said first portion of a first one of said first plurality of electrode regions being situated on said substrate between the first portion of each of a second and a third one of said first plurality of electrode regions, said first portion of said first electrode region and said first portion of said second electrode region forming at least a portion of a first transducer, said first portion of said first electrode region and said first portion of said third electrode region forming at least a portion of a second transducer, and wherein a second portion of said second electrode region and a second portion of said third electrode region are situated adjacent to one another on said substrate and form at least a portion of a third transducer; and a second plurality of electrode regions disposed on said substrate, each of said second electrode regions having at least a first portion, said first portion of a first one of said second plurality of electrode regions being situated on said substrate between the first portion of each of a second and a third one of said second plurality of electrode regions, said first portion of said first one of said second plurality of electrode regions and said first portion of said second one of said second plurality of electrode regions forming at least a portion of a fourth transducer, said first portion of said first one of said second plurality of electrode regions and said first portion of said third one of said second plurality of electrode regions forming at least a portion of a fifth transducer, and wherein a second portion of said second electrode region of said second plurality of electrode regions and a second portion of said third electrode region of said second plurality of electrode regions are situated adjacent to one another on said substrate and form at least a portion of a sixth transducer.

12. A filter as set forth in claim 11, wherein said first and second pluralities of electrode regions have a substantially symmetrical arrangement relative to at least one axis of said filter.

13. A filter as set forth in claim 11, wherein a third portion of said third one of said first plurality of electrode regions and a second portion of said first one of said second plurality of electrode regions are disposed adjacent to one another on said substrate and form at least a portion of a seventh transducer.

14. A filter as set forth in claim 11, wherein said first electrode region of each of said first and second pluralities of electrode regions is for being connected to an external ground, said second electrode region of said first plurality of electrode regions is an input terminal, and said third electrode region of said second plurality of electrode regions is an output terminal.

15. A filter, said filter comprising:
    a substrate;
    a first plurality of electrodes disposed on said substrate, a first portion of a first one of said first plurality of electrodes and a portion of a second one of said first plurality of electrodes being disposed adjacent to one another on said substrate and forming at least a portion of a first transducer, a second portion of said first one of said first plurality of electrodes and a portion of a third one of said first plurality of electrodes being disposed adjacent to one another on said substrate and forming at least a portion of a second transducer, a third portion of said first one of said first plurality of electrodes and a portion of a fourth one of said first plurality of electrodes also being disposed adjacent to one another on said substrate and forming at least a portion of a third transducer; and
    a second plurality of electrodes disposed on said substrate, a first portion of a first one of said second plurality of electrodes and a portion of a second one of said second plurality of electrodes being disposed adjacent to one another on said substrate and forming at least a portion of a fourth transducer, a second portion of said first one of said second plurality of electrodes and a portion of a third one of said second plurality of electrodes being disposed adjacent to one another on said substrate and forming at least a portion of a fifth transducer, a third portion of said first one of said second plurality of electrodes and a portion of a fourth one of said second plurality of electrodes also being disposed adjacent to one another on said substrate and forming at least a portion of a sixth transducer;

wherein a fourth portion of said first one of said first plurality of electrodes and a fourth portion of said first one of said second plurality of electrodes are disposed adjacent to one another on said substrate and form at least a portion of a seventh transducer.

16. A filter as set forth in claim 15, wherein said first and second pluralities of electrodes have a substantially symmetrical arrangement relative to at least one axis of the filter.

17. A filter as set forth in claim 15, wherein said second and fourth ones of said first and second pluralities of electrodes are connected together externally of said substrate, and are for being coupled to ground, said third one of said first plurality of electrodes is an input terminal, and said third one of said second plurality of electrodes is an output terminal.

18. A filter as set forth in claim 15, and further comprising:

a first plurality of fingers extending from said first portion of said first one of said first plurality of electrodes;

a second plurality of fingers extending from said second portion of said first one of said first plurality of electrodes;

a third plurality of fingers extending from said third portion of said first one of said first plurality of electrodes;

a fourth plurality of fingers extending from said portion of said second one of said first plurality of electrodes;

a fifth plurality of fingers extending from said portion of said third one of said first plurality of electrodes; and a sixth plurality of fingers extending from said portion of said fourth one of said first plurality of electrodes;

wherein said first plurality of fingers are interleaved with said fourth plurality of fingers, said second plurality of fingers are interleaved with said fifth plurality of fingers, and said third plurality of fingers are interleaved with said sixth plurality of fingers.

19. A filter as set forth in claim 18, and further comprising:

a seventh plurality of fingers extending from said first portion of said first one of said second plurality of electrodes;

an eight plurality of fingers extending from said second portion of said first one of said second plurality of electrodes;

a ninth plurality of fingers extending from said third portion of said first one of said second plurality of electrodes;

a tenth plurality of fingers extending from said portion of said second one of said second plurality of electrodes;

an eleventh plurality of fingers extending from said portion of said third one of said second plurality of electrodes;

a twelfth plurality of fingers extending from said portion of said fourth one of said second plurality of electrodes;

a thirteenth plurality of fingers extending from said fourth portion of said first one of said first plurality of electrodes; and a fourteenth plurality of fingers extending from said fourth portion of said first one of said second plurality of electrodes;

wherein said first thirteenth plurality of fingers are interleaved with said fourteenth plurality of fingers, said seventh plurality of fingers are interleaved with said tenth plurality of fingers, said eight plurality of fingers are interleaved with said eleventh plurality of fingers, and said ninth plurality of fingers are interleaved with said twelfth plurality of fingers.

* * * * *